United States Patent [19]

Baba et al.

[11] Patent Number: 5,258,670
[45] Date of Patent: Nov. 2, 1993

[54] LIGHT TRIGGERED & QUENCHED STATIC INDUCTION THYRISTOR CIRCUIT

[75] Inventors: Akira Baba; Masayuki Saito; Masaaki Katsumata; Shigemi Endo, all of Shizuoka, Japan

[73] Assignee: Yazaki Corporation, Tokyo, Japan

[21] Appl. No.: 858,630

[22] Filed: Mar. 27, 1992

[30] Foreign Application Priority Data

Mar. 29, 1991 [JP] Japan ................. 3-066648

[51] Int. Cl.⁵ ..................... H03K 17/56; H03K 3/42
[52] U.S. Cl. ................... 307/631; 307/633; 307/642; 307/311
[58] Field of Search ............. 307/631, 633, 642, 311

[56] References Cited

U.S. PATENT DOCUMENTS

| | | | |
|---|---|---|---|
| 4,039,863 | 8/1977 | Ohhinata et al. | 307/631 |
| 4,509,069 | 4/1985 | Stoisiek | 307/633 |
| 4,816,891 | 3/1989 | Nishizawa | 307/631 |

FOREIGN PATENT DOCUMENTS 0158186 10/1985 European Pat. Off. .
0261631 3/1988 European Pat. Off. .

OTHER PUBLICATIONS

Patent Abstracts of Japan, vol. 14, No. 324 (E-951) Jul. 11, 1990.
IEEE Electron Device Letters, vol. EDL-7, No. 4, Apr. 1986, "Functional Integration of the Light Triggered Static Induction Thyristor and the Static Induction Phototransistor", J. Nishizawa et al. pp. 265-267.

*Primary Examiner*—William L. Sikes
*Assistant Examiner*—Toan Tran
*Attorney, Agent, or Firm*—Sughrue, Mion, Zinn, Macpeak & Seas

[57] ABSTRACT

A LTQ (light triggered & quenched) static induction thyristor circuit of the present invention is to provide a LTQ static induction thyristor circuit obtaining an excellent dv/dt capability and operating ambient temperature characteristics, a large optically controllable current capability, and simple structure. A main static induction thyristor turns on when its gate receives an optically triggering pulse and causes a current to flow through a load from a positive terminal of a power supply. A photothyristor turns on when its gate receives an optically quenching pulse and causes the gate to a negative power supply voltage to turn off. At this point, a first resistor functions in such a manner as to hold turned on for a predetermined time period even after application of has been ended. By the flow of such current through a first resistor, the gate is biased to a negative voltage.

7 Claims, 7 Drawing Sheets

5,258,670

LIGHT TRIGGERED & QUENCHED STATIC INDUCTION THYRISTOR CIRCUIT

BACKGROUND OF THE INVENTION

The invention relates to light triggered & quenched static induction thyristor (referred to as LTQ SI thyristor) drive circuits, and more particularly, to a drive circuit for a LTQ SI thyristor that is turned on and off by optical triggering and quenching.

A circuit shown in FIG. 12 has been proposed as a Conventional example of this type of circuit. In FIG. 12, reference character Q1 designates a main static induction (SI) thyristor; Q2, a static induction phototransistor (SIPT) consisting of a static induction phototransistor (SIPT) Q2a and an auxiliary static induction phototransistor (SIPT) Q2b which are in Darlington connection; and R, a speed-up resistor.

The gate of main SI thyristor Q1 and the source of main SIPT Q2a of SIPT Q2 are connected to each other, the gate of main SIPT Q2a of SIPT Q2 and the source of auxiliary SIPT Q2b are connected to each other, the cathode of main SI thyristor Q1 and the gate of auxiliary SIPT Q2b are connected to each other through resistor R, and the drains of main SIPT Q2a and auxiliary SIPT Q2b are connected to each other. The anode of main SI thyristor Q1 is connected to a power supply $V_A$ through a load RL and its cathode is grounded. A drain voltage $V_D$ is applied to the mutually connected drains.

In the above construction, main SIPT Q2a and auxiliary SIPT Q2b are off and main SI thyristor Q1 is also off in the normal state. When an optically triggering photopulse LT is applied to main SI thyristor Q1, a pair consisting of electrons and holes is generated at a depletion region extending between its gate and anode and the holes are stored at the gate region. As a result, the gate voltage of main SI thyristor Q1 which has been slightly negative becomes positive, and this voltage then acts as a gate triggering voltage to forward-bias the gate region.

The static induction effect at the gate decreases a potential barrier within the channel, causing electrons to be injected from the cathode region. Electrons generated by the injected electrons and light decrease a potential barrier possessed by the holes at the anode region, thus causing the holes to be injected from the anode. When the potential at the gate region exceeds a turn-on threshold potential, main SI thyristor Q1 turns on.

Also, when an optically quenching photopulse LQ is applied to auxiliary SIPT Q2b to drive SIPT Q2 as a whole with main SI thyristor Q1 being turned on, the gate voltage of main SI thyristor Q1 drops to $V_D$, and the holes stored at the gate region of main SI thyristor Q1 is discharged through SIPT Q2. Further, the hole current injected from the anode flows through SIPT Q2, so that main SI thyristor Q1 turns off.

In the case of the conventional drive circuit described with reference to FIG. 12, P-channel Darlington connected SIPT is used and this type of SIPT suffers from leak when the operating ambient temperature increases, and the gate of main SI thyristor Q1 is biased negatively to a great degree so that main SI thyristor cannot be turned on with small light intensity. As shown in FIG. 13, the maximum operating ambient temperature permitting the normal operation of the circuit is set to 60° C. under an anode current of 10A and an anode voltage of 600 V and to as low as 25° C. under an anode current of 20A and an anode voltage of 400 V when the circuit is operated at a switching frequency of 1 kHz and at a duty ratio of 50%. This disadvantageously makes the circuit inoperable under high current and high voltage when the operating ambient temperature is high.

Further, when the application of the optically quenching photopulse LQ has been ended to turn off SIPT Q2, the potential at the gate of main SI thyristor Q1 is determined by the static characteristic of SIPT Q2 in the dark state and the static characteristic of main SI thyristor Q1 in the dark state, and the gate bias at this timing rises to a level extremely close to zero. As a result, the dv/dt capability becomes so small that the circuit tends to operate erroneously.

Still further, the use of P-channel Darlington-connected SIPT suppresses $I_D$ to the order of several amperes due to restrictions in optical gain. This principally confines the optically controllable current to as low as 40A or so.

To overcome these problems, there is a circuit for quenching main SI thyristor Q1 such as shown in FIG. 14. This circuit uses a quench SI thyristor Q2c having four layers which is highly resistant to leak and a P-channel SIT Q2d for holding quench SI thyristor Q2c in turn-off state while making the gate region of quench SI thyristor Q2c negative, so that a high operating ambient temperature and an excellent dv/dt withstand voltage characteristic can be ensured.

However, in the circuit shown in FIG. 14, quench SI thyristor Q2c must be turned off by injecting a photopulse LQb to P-channel SIT Q2d to turn P-channel SIT Q2d and negatively bias the gate of quench SI thyristor Q2c after quench SI thyristor Q2c has been turned on by receiving an optically quenching photopulse LQa at its gate region. This imposes a problem that not only LEDs (light-emitting diodes) but also an optical drive circuit, etc., must additionally be employed.

SUMMARY OF THE INVENTION

The invention has been made in view of the above conventional problems. Accordingly, an object of the invention is to provide a LTQ static induction thyristor drive circuit ensuring an excellent dv/dt capability characteristic, a high operating ambient temperature, a high optically controllable current, as well as a simple circuit configuration.

To overcome the above problems, a LTQ static induction thyristor drive circuit of the invention includes: a main photostatic induction thyristor, its anode being connected to the positive terminal of a power supply through a load, its cathode being connected to the ground, and its gate and cathode interposing a first resistor therebetween; and a photothyristor, such as a photostatic induction thyristor, its anode being connected to the gate of the main static induction thyristor, its cathode being connected to the negative terminal of a power supply, and its gate and cathode interposing a second resistor therebetween. The main static induction thyristor is turned on by receiving an optically triggering pulse, while the photothyristor is turned on by receiving an optically quenching pulse to thereby turn off the main static induction thyristor. A resistance of the second resistor connected between the gate and cathode of the photothyristor is set so as to allow the photothyristor to be held in the on state and a holding current obtained from the photothyristor held in the on state to flow continuously across the first resistor after the injection of the optically quenching pulse has been ended, so that the gate of the main static induction thyristor is negatively biased by the holding current that flows through the first resistor.

The main static induction thyristor and the photothyristor made of a photostatic induction thyristor are formed into two chips or a single chip.

As a result of the above construction, the main SI thyristor turns on by receiving the optically triggering pulse at its gate, and allows a current to flow from the positive terminal of the power supply. The photothyristor turns on by receiving the optically quenching pulse, and causes the gate voltage of the main static induction thyristor to decrease to a negative level to thereby turn off the main SI thyristor. At this point, the second resistor acts so that the on state of the photothyristor can be held for a predetermined time interval even after the injection of the optically quenching pulse has been ended, and the current derived from such photothyristor in the on-state thereby flows through the first resistor. As a result, the gate of the main SI thyristor is negatively biased. After this interval the photothyristor turns off naturally to complete a cycle of switching operations when the discharging current $I_D$ has become lower than the holding current $I_H$ of the photothyristor.

Further, the feature of using the photothyristor to turn off the main SI thyristor contributes to the reduction of leaks caused by increase in temperature. Still further, the presence of the first and second resistors allows the turn-on period of the photothyristor to be set so that the gate voltage of the main SI thyristor can be restored to a predetermined level.

DETAILED DESCRIPTION OF THE PREFERRED EMBODIMENTS

Figure 1:
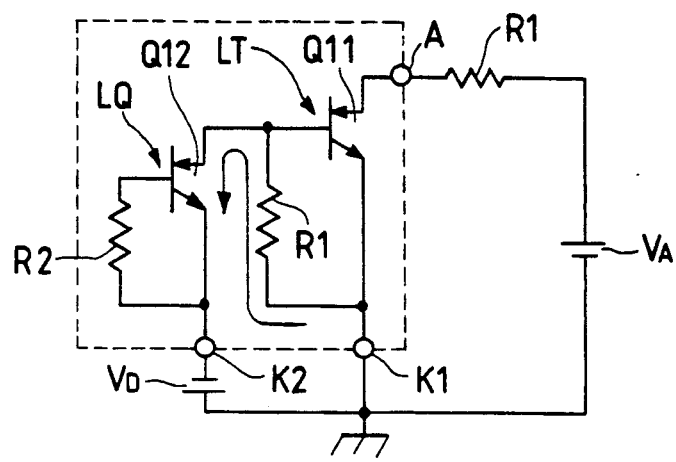
FIG. 1 is a circuit diagram of LTQ SI thyristor, which is an embodiment of the invention.

Embodiments of the invention will hereunder be described with reference to the drawings. FIG. 1 is a circuit diagram showing a LTQ (Light triggered & quenched) SI thyristor, which is an embodiment of the invention. In FIG. 1, reference character Q11 designates a main static induction (SI) thyristor; Q12, a quench static induction (SI) thyristor; R1, a resistor connected between the gate and cathode of main SI thyristor Q11; and R2, a resistor connected between the gate and cathode of quench SI thyristor Q12.

The gate of main SI thyristor Q11 and the anode of quench SI thyristor Q12 are connected to each other. The anode of main SI thyristor Q11 is connected to a power supply $V_A$ through a load RL, the cathode of main SI thyristor Q11 is connected to a ground, and a negative voltage V is applied to the cathode of quench SI thyristor Q12.

Figure 2:
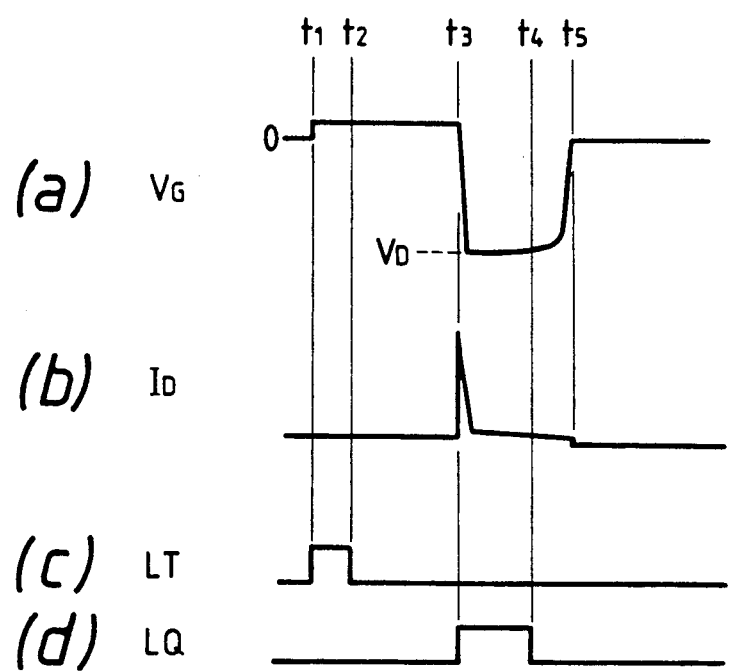
FIG. 2 (a) to (d) are switching waveforms at respective points in the circuit shown in FIG. 1.

An operation of the thus configured circuit will be described with reference to FIG. 2, which shows waveforms at respective points. Quench SI thyristor Q11 and main SI thyristor Q12 are turned off in the normal state. When an optically triggering photopulse LT is injected to the gate of main SI thyristor Q11 at timing $t_1$, a pair consisting of electrons and holes is generated at a depletion region extending between its gate and anode, causing holes to be stored at its gate region.

As a result, the gate voltage $V_G$ of main SI thyristor Q11 which has been slightly negative up to this moment becomes positive, and this positive voltage acting as a gate triggering voltage to forward-bias the gate region. The static induction effect at the gate decreases the potential barrier within the channel, causing electrons to be injected from the cathode region. Electrons generated by the injected electrons and light cause injection of the holes from the anode while decreasing the magnitude of the potential barrier possessed by the holes at the anode region. When the increasing potential at the gate region exceeds a turn-on threshold potential, main SI thyristor Q11 turns on. The turn-on state of main SI thyristor Q11 continues even after the injection of the optically triggering photopulse LT has been ended at timing $t_2$.

Further, when an optically quenching photopulse LQ is injected to the gate of quench SI thyristor Q12 at timing $t_3$ with main SI thyristor Q11 turned on, the gate voltage of quench SI thyristor Q12 becomes positive, and this voltage acts as a gate triggering voltage to forward-bias its gate region. This electrostatic induction effect at the gate decreases the potential barrier within the channel, inducing injection of electrons from the cathode region. When the increasing potential at the gate region exceeds turn-on threshold Potential, quench SI thyristor Q12 turns on.

As quench SI thyristor Q12 has turned on, the gate voltage of main SI thyristor Q11 decreases to $V_D$. The holes stored at the gate region of main SI thyristor Q11 in the on-state are discharged and taken away through quench SI thyristor Q12, while the hole current injected from the anode also flows through quench SI thyristor Q12. As a result, the main SI thyristor Q11 turns off.

The above-mentioned quench SI thyristor Q12 continues to be turned on up to a moment at which the discharging current $I_D$ becomes lower than the holding current $I_S$ even after the injection of quenching photopulse LQ has been ended at timing $t_4$ after main SI thyristor Q12 has turned off, causing current to flow from the ground through resistor R1 in a direction indicated by an arrow, and turns off naturally to complete a cycle of switching operations when the discharging current $I_s$ has become lower than the holding current $I_S$ at timing $t_3$. The first and second resistors and the holding current $I_H$ determine the time of period from turning on the quench SI thyristor Q12 to the end of the switching operation. By the flow of the holding current $I_H$, the gate voltage $V_C$ of main SI thyristor Q11 can drastically be restored to a slightly negative level.

The above-mentioned restored gate voltage $V_C$ of main SI thyristor Q11 is determined by both the resistance of resistor R1 and the timing at which the holding current no longer flows through quench SI thyristor Q12, i.e., the resistance of resistor R2.

Figure 3:
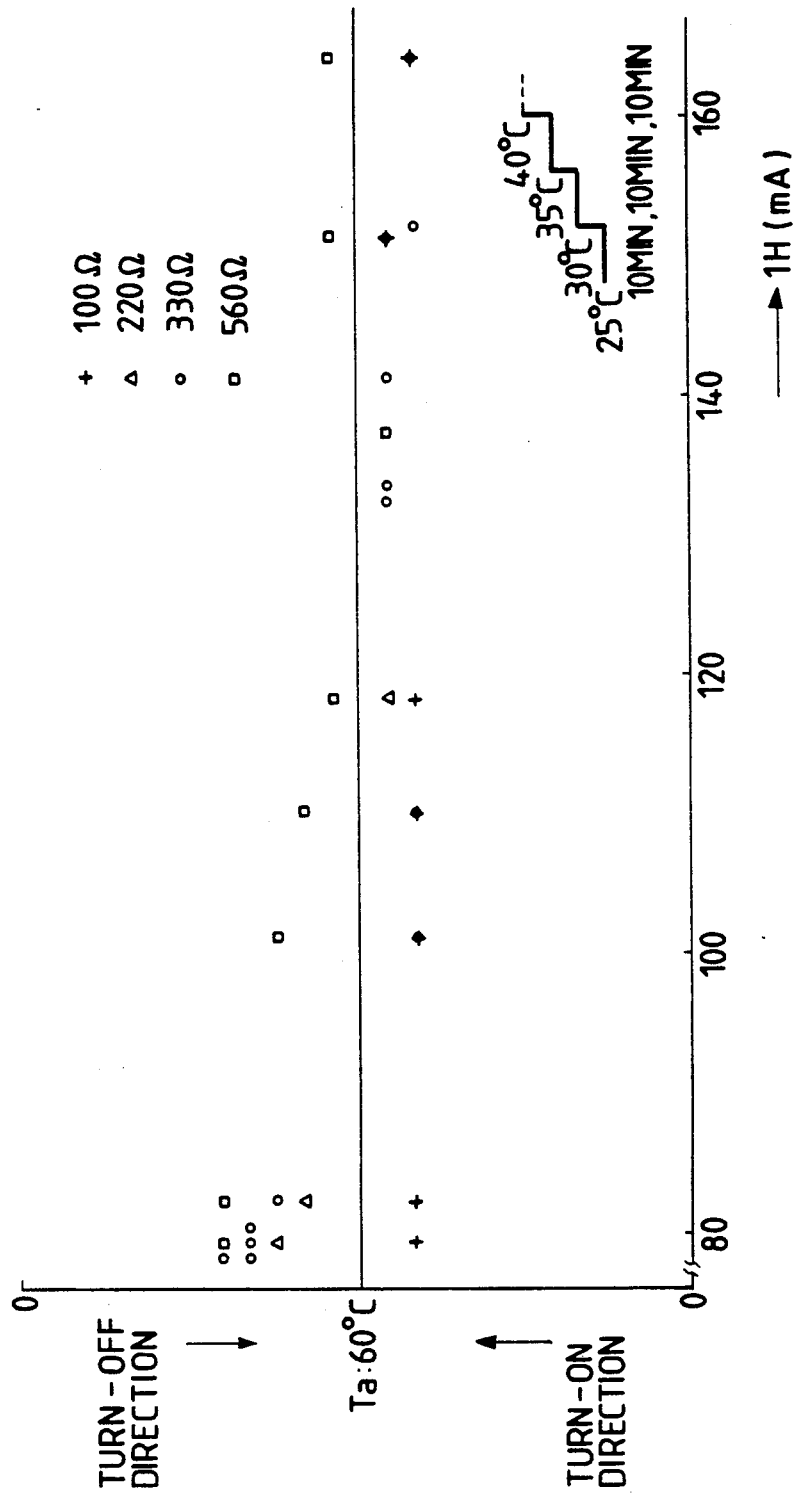
FIG. 3 is a diagram showing an operating ambient temperature $T_a$—holding current $I_B$ characteristic at respective resistor in the circuit shown in FIG. 1.

In the circuit shown in FIG. 1 thyristors, each having a holding current $I_H$ of 80 to 160 mA, are used as main SI thyristor Q11 and quench SI thyristor Q12; a resistor having a resistance of 330 Ω is used as resistor R1; and resistors having resistances of 100, 220, 380, or 560 Ω, respectively, are used as resistor R2 so as to be changed from one to another. The circuit was operated with a switching frequency of 1 kHz, a duty ratio of 50%, an anode current of 20A, power supply voltages $V_A$ and $V_D$ of 600 V and −20 V, respectively, while increasing the temperature from 25° C. (10 minutes), 30° C. (10 minutes), 35° C. (10 minutes), and 40° C. in a thermostatic chamber. As shown in an operating ambient temperature Ta-holding current $I_H$ characteristic diagram in FIG. 3, it has been found out that the on-state of main SI thyristor Q11 cannot be held when the resistance of resistor R2 is other than 100 Ω, and that if the resistance of resistor R2 is too small, main SI thyristor Q11 cannot be turned off.

Figure 4:
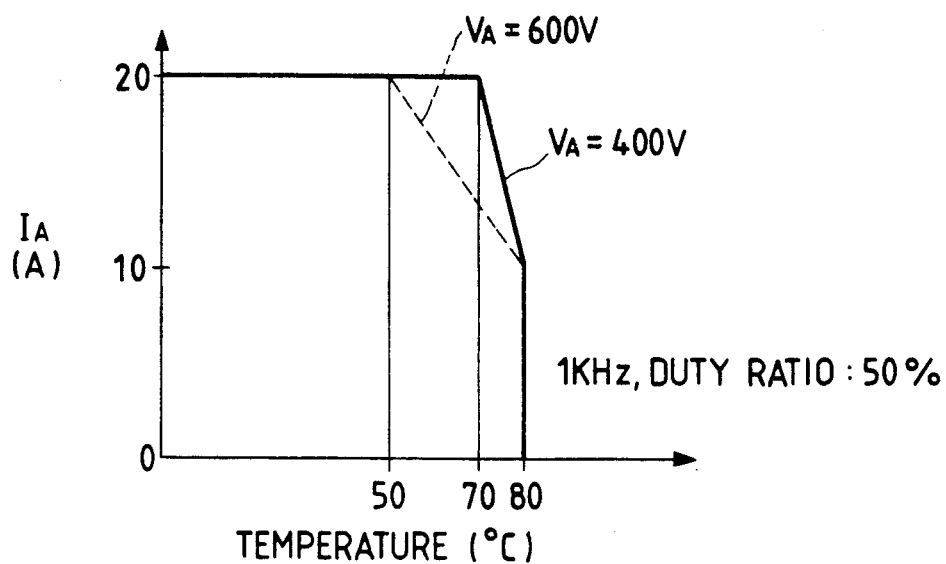
FIG. 4 is a diagram showing an operating ambient temperature $T_a$—Anode current $I_A$ characteristic in the circuit shown in FIG. 1.
Figure 5:
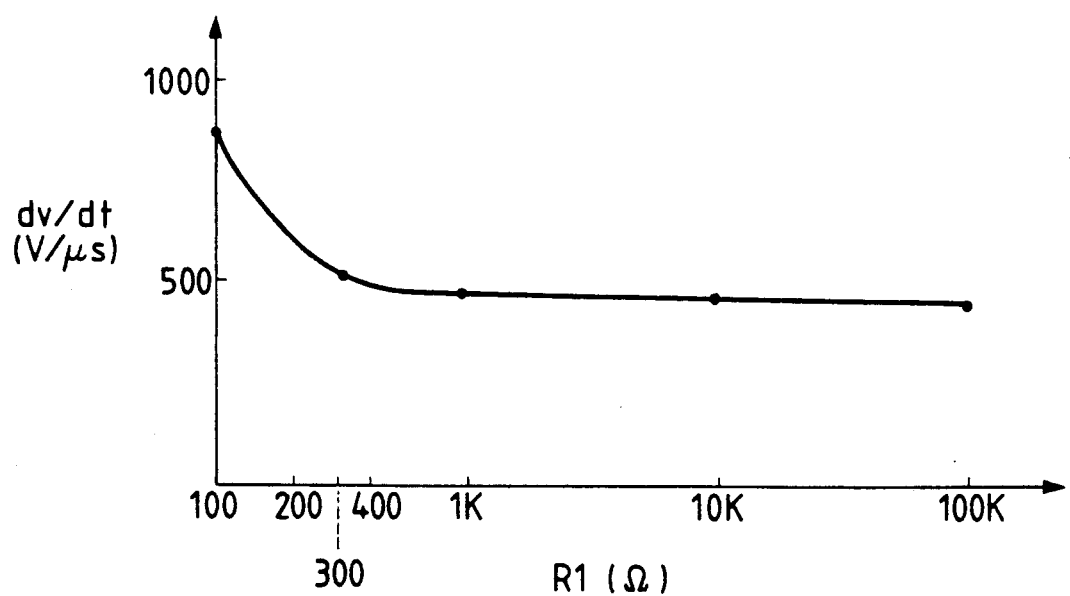
FIG. 5 is a diagram showing a relationship between the resistance of the resistor connecting a main SI thyristor and its dv/dt capability.

It has been verified from the above experiment that a resistance of resistor R2 which is 100±20 Ω is optimal for the 80–160 mA holding current $I_H$, and that it is under this condition that the operating ambient temperature becomes highest and that an operating ambient temperature Ta-current $I_A$ characteristic such as shown in FIG. 4 can be obtained. As shown in FIG. 5, it has also been verified that the dv/dt capability of main SI thyristor Q11 increases with decreasing resistance of resistor R1 and that a resistance of 250 to 350 Ω is optimal for resistor R1, taking the restored gate voltage account.

Figure 6:
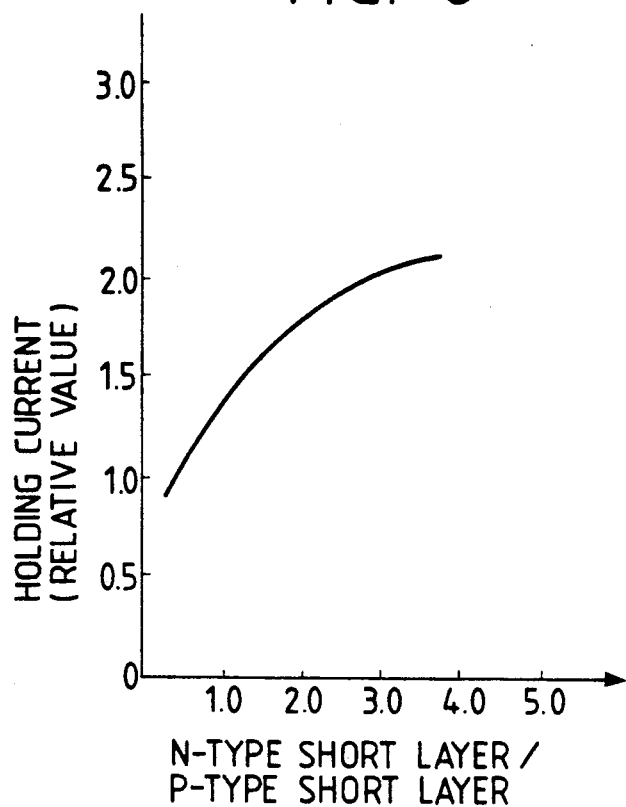
FIG. 6 is a diagram showing a relationship between the shorting rate of an anode-emitter short structure and its holding current.

The holding current $I_H$ is determined by the structures of main SI thyristor Q11 and quench SI thyristor Q12. The holding current $I_H$ can be set while employing an anode-emitter short structure, a cathode-emitter short structure, or the like. A relationship between the short rate and the holding current of the anode-emitter short structure is as shown in FIG. 6. The horizontal axis indicates an area ratio of an n-type short layer to a p-type anode layer.

Further, when −20 V is used as the power supply voltage $V_D$ as described above, the peak value of $I_D$ can be 10 to 15A. By employing a quenching element as a photothyristor, restrictions as shown conventional LTQ SI thyristor on the optically controllable current is eliminated in principle.

A portion surrounded by a dotted line in the FIG. 1 circuit can be formed into a single chip or two-chip module. Examples of such structures will be described with reference to FIGS. 7 through 11.

Figure 7:
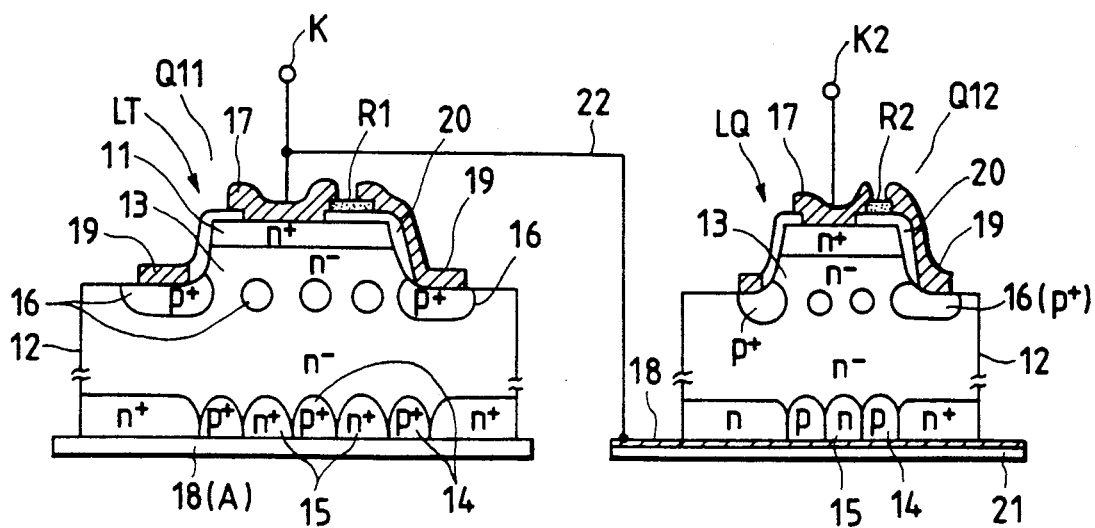
FIG. 7 is a diagram showing an exemplary structure of a two-chip module.

FIG. 7 is an exemplary two-chip module in which each of a main SI thyristor Q11 and a quench SI thyristor Q12 has an buried structure gate type with anode-emitter short structure. Since both thyristors Q11, Q12 have substantially the same structure, the structure of thyristor Q11 will be described in detail. Main SI thyristor Q11 includes: an n+-type cathode region 11; n−-type high resistance regions 12, 13; a p+-type anode region 14; an n+-type emitter region 15; a p+-type gate region 16; a cathode electrode 17; an anode electrode 18; a gate electrode 19; an insulating layer 20; and a resistor R1. The electrodes are made of aluminum.

The p+-type gate region 16 is arranged in mesh or stripe form, and connected to the gate electrode 19 at its peripheral portion. The n−-type high resistance region interposed with the p+-type gate region 16 form a channel region into which electrons from the n+-type cathode region 11 are injected. This channel region is depleted of carriers by a diffusion potential between the p+-type gate region 16 and the n−-type high resistance region, or a reverse-bias voltage applied to the gate electrode 19. The potential at the channel region is capacitively controlled by the potential of the p+-type gate region 16. Further, the p.-type anode region 14 and the n+-type emitter region 15 are arranged alternately. Resistor R1 is formed of polycrystalline silicon on the insulating layer 20, an end of which is connected to the cathode electrode 17 and the other end to the gate electrode 19.

On the other hand, the anode electrode 18 of quench SI thyristor Q12 is insulated by an insulating substrate 21 and is interconnected by a lead 22 to the cathode electrode 17 of main SI thyristor Q11. A resistor R2 is formed of polycrystallize silicon on an insulating layer 20 and interconnects a cathode electrode 17 and a gate electrode 19.

Figure 8:
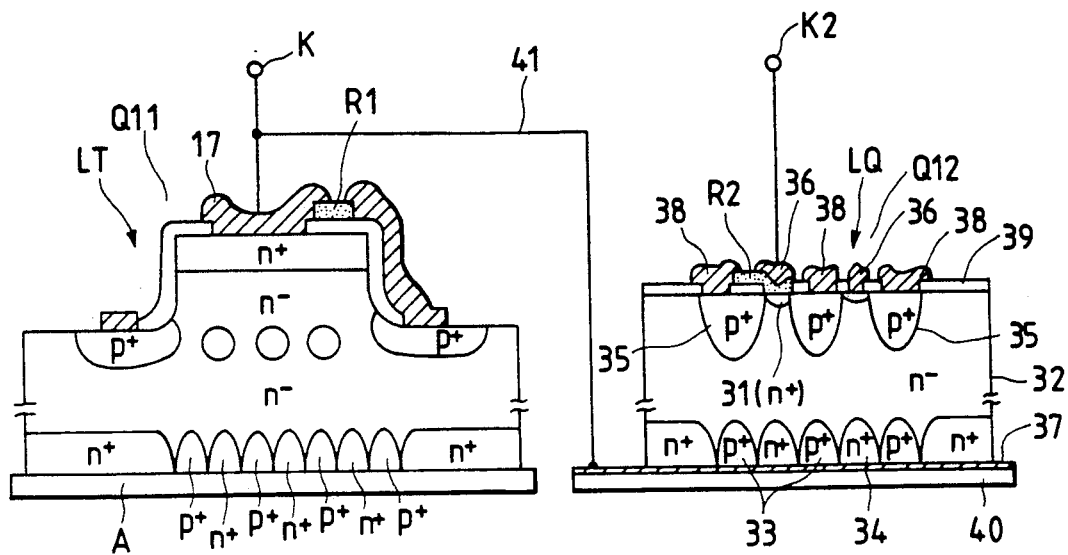
FIG. 8 is a diagram showing another exemplary o structure of a two-chip module.

FIG. 8 shows an exemplary two-chip module in which a main SI thyristor Q11 has the buried gate structure type with anode-emitter short structure and a quench SI thyristor Q12 has a surface gate structure type with cathode-emitter short structure. Since main SI thyristor Q11 is the same as the one shown in FIG. 7, the other thyristor Q12 will be described in detail. Quench SI thyristor Q12 includes: an n+-type cathode region 31; an n−-type high resistance region 32; a p+-type anode region 33; an n+-type emitter region 34; a p+-type gate region 35; a cathode electrode 36; an anode electrode 37; a gate electrode 38; an insulating layer 39; and a resistor R2. The electrodes are made of aluminum.

The anode electrode 37 of quench SI thyristor Q12 is insulated by an insulating substrate 40 and is interconnected by a lead 41 to a cathode electrode 17 of main SI thyristor Q11. Resistor R2 is formed of polycrystalline silicon on an o insulating layer 20 and interconnects the cathode electrode 37 and the gate electrode 38.

Figure 9:
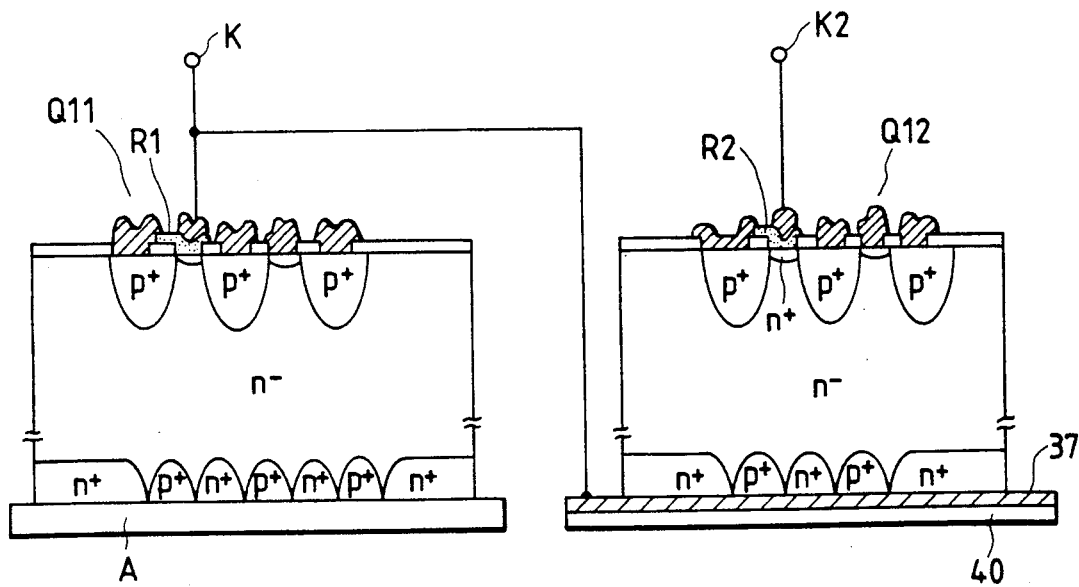
FIG. 9 is a diagram showing still another exemplary structure of a two-chip module.

FIG. 9 shows an exemplary two-chip module in which each of a main SI thyristor Q11 and a quench SI thyristor Q12 has the surface gate structure type with anode-emitter short structure. Since each thyristor structure is the same as the one shown in FIG. 8, its description will be omitted. Also, a cathode-emitter short structure may in some cases be employed in the surface gate type thyristors shown in FIGS. 8 and 9.

Figure 10:
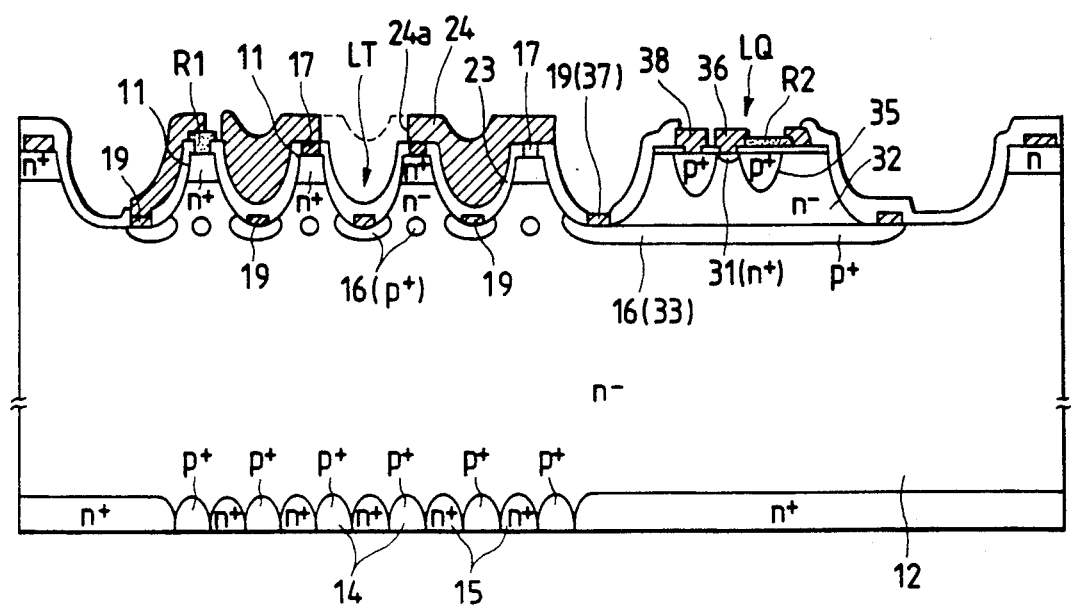
FIG. 10 is a diagram showing an exemplary structure of a single chip module.

FIG. 10 shows an exemplary single chip module in which a main SI thyristor Q11 has the buried gate type with anode-emitter short structure and a surface gate type quench SI thyristor Q12 integrated on its p+-type diffusion layer. A p+-type gate region 16 of main SI thyristor Q11 and an anode region 33 of quench SI thyristor Q12, as well as a gate electrode 19 of main SI thyristor Q11 and an anode electrode 37 of quench SI thyristor Q12 are made common, respectively.

In this single chip module a cathode region 11 of main SI thyristor Q11 is formed into a plurality of island-like portions, its cathode electrodes 17 are interconnected by a second aluminum layer 24 while insulated from its gate electrodes 19. A window 24a through which an optically triggering pulse LT is injected to its gate region 16 is formed on part of the second aluminum layer 24.

Figure 11:
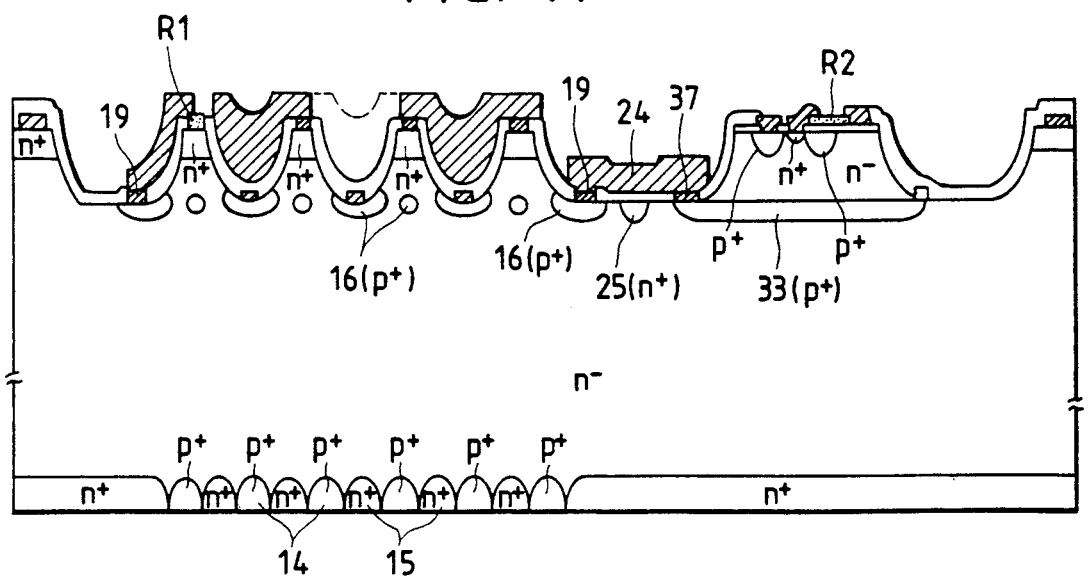
FIG. 11 is a diagram showing another exemplary structure of a single chip module.
Figure 12:
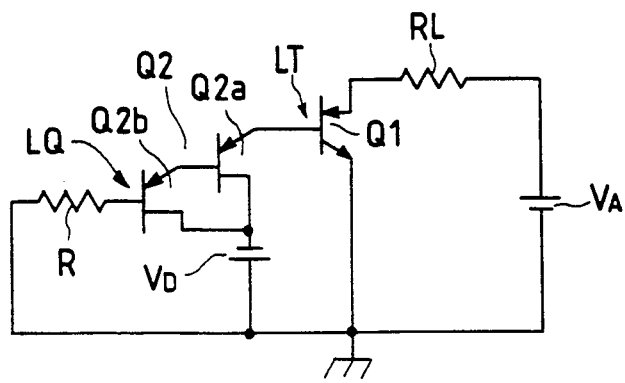
FIG. 12 is a circuit diagram showing an exemplary conventional photostatic induction thyristor drive circuit.
Figure 13:
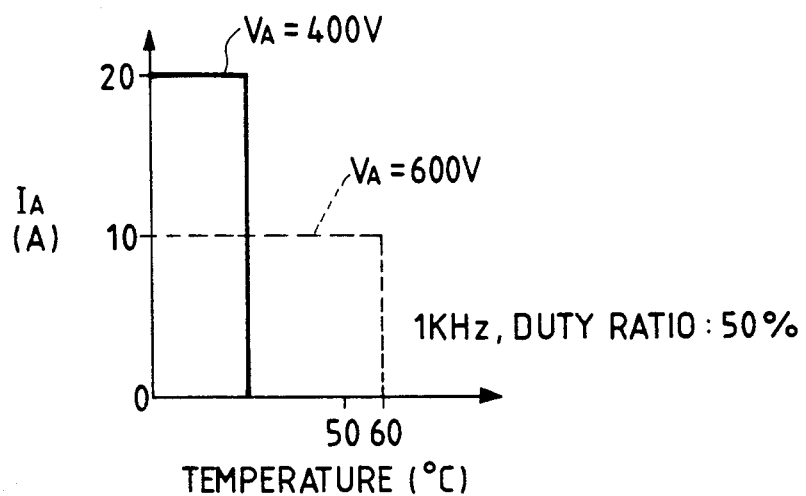
FIG. 13 is a diagram showing an operating ambient temperature $T_a$—current $I_A$ in the circuit shown in FIG. 12.
Figure 14:
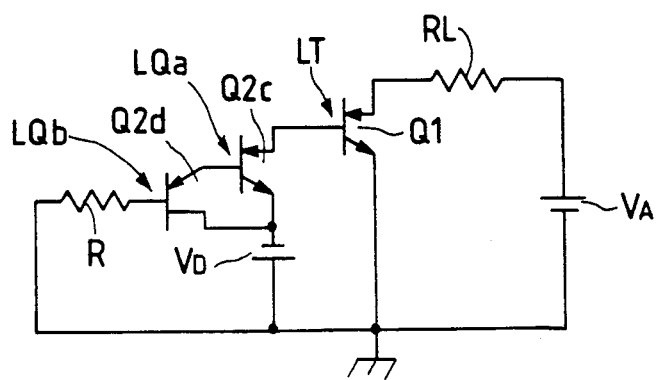
FIG. 14 is a circuit diagram of another exemplary conventional LTQ SI thyristor drive.

FIG. 11 shows an exemplary single chip module in which a main SI thyristor Q11 having the buried gate type with anode-emitter short structure and a surface gate type quench SI thyristor Q12 are integrated while separated. A p+-type gate region 16 of main SI thyristor Q11 and an anode region 33 of quench SI thyristor Q12 are separated by an n+-type stopper region 25, while a gate electrode 19 of main SI thyristor Q11 and an anode region 37 of quench SI thyristor Q12 are interconnected by a second aluminum layer 24 insulated by an insulating layer 23.

While quench SI thyristor Q12 is employed in the above-mentioned embodiments, other types of photothyristors may also be used as long as they satisfy characteristics such as the holding current.

As described in the foregoing pages, the invention, comprising the main SI thyristor, the photothyristor, the first and second resistors, is simple in circuit structure. Further, the feature of using the photothyristor to turn off the main SI thyristor contributes to the reduction of leaks caused by increase in temperature. Still further, the presence of the first and second resistors allows the turn-on period of the photothyristor to be set so that the gate voltage of the main SI thyristor can be restored to a predetermined level. As a result, advantages such as an excellent dv/dt capability characteristic and a satisfactory operating ambient temperature characteristic, and a large optically controllable current owing to the use of a thyristor as a quenching element, can be obtained.

What is claimed is:

1. A light triggered & quenched static induction thyristor circuit comprising:

a main static induction thyristor, an anode of said thyristor being connected to a positive terminal of a power supply through a load, a cathode of said thyristor being connected to a ground, and the gate of said main static induction thyristor and said cathode interposing a first resistor therebetween; and a photothyristor, an anode of said photothyristor being connected to said gate of said main static induction thyristor, a cathode of said photothyristor being connected to a negative terminal of said power supply, and a gate of said photothyristor and said cathode thereof interposing a second resistor therebetween.

2. A light triggered & quenched static induction thyristor circuit as claimed in claim 1, wherein said main static induction thyristor is turned on by receiving an optically triggering pulse at said gate thereof, and said photothyristor is turned on by receiving an optically quenching pulse at said gate thereof to thereby turn off said main static induction thyristor.

3. A light triggered & quenched static induction thyristor circuit as claimed in claim 2, wherein after an injection of said optically quenching pulse is ended, a resistance of said second resistor is set to allow said photothyristor to be held in the on state and a current obtained from said photothyristor held in the on state to flow continuously across said first resistor, so that said gate of said main static induction thyristor is negatively biased by said current flowing through said first resistor.

4. A light triggered & quenched static induction thyristor as claimed in claim 3, wherein after said injection of said optically quenching pulse is ended, when a discharging current becomes lower than said current of said photothryristor in accordance with a time of period owing said first and second resistors and a value of said current, the photothyristor turns off naturally.

5. A light triggered & quenched photothyristor as claimed in claim 1, wherein said photothyristor includes a photostatic induction thyristor.

6. A light triggered & quenched static induction thyristor as claimed in claim 1, wherein said main static induction thyristor and said photothyristor are formed into an individual chip, respectively.

7. A light triggered & quenched static induction thyristor as claimed in claim 1, wherein said main static induction thyristor and said photothyristor are formed into a single chip.

* * * * *